United States Patent
Pschenitzka

(10) Patent No.: US 7,242,141 B2
(45) Date of Patent: Jul. 10, 2007

(54) INTEGRATED FUSES FOR OLED LIGHTING DEVICE

(75) Inventor: Florian Pschenitzka, San Jose, CA (US)

(73) Assignee: Osram Opto Semiconductor GmbH, Regensburg (DE)

(*) Notice: Subject to any disclaimer, the term of this patent is extended or adjusted under 35 U.S.C. 154(b) by 263 days.

(21) Appl. No.: 10/951,479

(22) Filed: Sep. 27, 2004

(65) Prior Publication Data

US 2006/0066223 A1 Mar. 30, 2006

(51) Int. Cl.
*H01J 1/62* (2006.01)
*H01J 63/04* (2006.01)
*H01J 7/44* (2006.01)
*H01J 13/46* (2006.01)
*H01L 21/82* (2006.01)

(52) U.S. Cl. ............... 313/506; 313/498; 313/504; 315/74; 315/119; 438/132

(58) Field of Classification Search .......... 313/498, 313/504, 505; 257/528; 438/132; 315/74, 315/127

See application file for complete search history.

(56) References Cited

U.S. PATENT DOCUMENTS

| | | | | |
|---|---|---|---|---|
| 3,109,959 | A * | 11/1963 | Delachapelle et al. ........ 315/74 |
| 5,530,318 | A * | 6/1996 | Ensign et al. ................. 315/74 |
| 6,680,578 | B2 * | 1/2004 | Antoniadis et al. ....... 315/169.3 |
| 6,791,114 | B2 * | 9/2004 | Shen ........................... 257/79 |
| 2003/0010985 | A1 * | 1/2003 | Shen ........................... 257/79 |
| 2003/0052616 | A1 * | 3/2003 | Antoniadis et al. ....... 315/169.3 |
| 2004/0075395 | A1 * | 4/2004 | Antoniadis et al. ....... 315/169.1 |
| 2004/0095300 | A1 | 5/2004 | So et al. |

FOREIGN PATENT DOCUMENTS

JP 2004296154 A * 10/2004

OTHER PUBLICATIONS

Machine translation of Suzurisato.*

* cited by examiner

*Primary Examiner*—Nimeshkumar D. Patel
*Assistant Examiner*—Peter Macchiarolo
(74) *Attorney, Agent, or Firm*—Cohen Pontani Lieberman & Pavane LLP

(57) ABSTRACT

An embodiment of the present invention pertains to an electroluminescent lighting device for area illumination. The lighting device is fault tolerant due, in part, to the patterning of one or both of the electrodes into strips, and each of one or more of these strips has a fuse formed on it. The fuses are integrated on the substrate. By using the integrated fuses, the number of external contacts that are used is minimized. The fuse material is deposited using one of the deposition techniques that is used to deposit the thin layers of the electroluminescent lighting device.

31 Claims, 7 Drawing Sheets

INTEGRATED FUSES FOR OLED LIGHTING DEVICE

GOVERNMENT RIGHTS

This invention was made with Government support under Contract No. DE-FC26-04NT41947 awarded by the Department of Energy. The Government has certain rights in the invention.

BACKGROUND OF THE INVENTION

The use of OLED panels as a lighting device is desirable—such as for area lighting in the workplace and the home. The OLED lighting device has characteristics that are different than an OLED display and these differences can be exploited to improve reliability and ease of manufacture while reducing cost. For example, electrical shorts are a major concern with OLED devices. A short occurs when any imperfection in the OLED causes its cathode to be in direct contact (or very close proximity) with its anode resulting in an area of much lower resistance than the remaining area between the anode and the cathode. Shorts may occur in any of the layers forming the element and may be caused by, for example, substrate imperfections or asperities, anode layer irregularities, non-uniformity of the one or more organic layers, and airborne particles introduced in the element structure during handling. While a pixel failure due to a short in an OLED display renders the display useless, a failure of a strip in the OLED lighting device may be acceptable as long as the resulting output luminance is not significantly deteriorated.

Furthermore, the OLED lighting device has to be significantly cheaper than an OLED display. Therefore, cost and yield considerations dictate that the OLED lighting devices are not manufactured such that electrical shorts are completely eliminated, thus, the lighting device should be manufactured to be fault tolerant. To make the OLED lighting device fault tolerant, either the anode or the cathode is separated into strips. In this case, if one of the strips has a short during device operation, then the shorted strip can be switched off without significantly deteriorating the output luminance of the lighting device. By switching off the shorted strip, the possibility of the entire lighting device failing is avoided. A fuse can be used to switch off a strip by significantly decreasing current flow through it when a large current flows through the fuse due to the short. Typically, a fuse is externally attached to each of the strips (i.e., a fuse is externally attached if it is not on the substrate) and because the fuses are externally attached, each of the strips requires an external contact. Manufacturing the lighting device with the external contacts for each strip is cumbersome. Also, external fuses also increase the complexity of the driver circuitry and the complexity of the connection components (e.g., the contact pad and the flex connector).

For the foregoing reasons, it is desirable to have electroluminescent lighting devices that exploit its unique characteristics to improve device reliability and efficiency while minimizing cost.

SUMMARY

An embodiment of a fault-tolerant electroluminescent lighting device is described. The device includes a substrate and a first electrode is on the substrate. In addition, the device includes a thin-film stack that is on the first electrode and this thin-film stack includes an electroluminescent layer. A second electrode is on the thin-film stack. A particular one of either the first electrode or the second electrode is patterned into multiple electrode strips and a particular one of the electrode strips has at least one gap that separates the particular electrode strip into multiple electrode segments. A fuse material at least partially covers a particular gap such that two adjacent electrode segments that are separated by the particular gap are electrically connected to each other, and the resistivity of the fuse material increases when a large current flows through the fuse material. The gaps are on the substrate. At least two of the electrode strips are coupled to a common external contact.

An embodiment of a method to fabricate a fault-tolerant electroluminescent lighting device is also described. The method includes forming a first electrode on a substrate, and forming a thin-film stack on the first electrode. The thin-film stack includes at least one layer and a particular one of the layer(s) is an electroluminescent layer. The method also includes forming a second electrode on the thin-film stack. Forming either the first electrode or the second electrode includes the following: (1) patterning the particular electrode into multiple electrode strips, and further patterning at least one gap on a particular one of the electrode strips so as to separate the particular electrode strip into multiple electrode segments; and (2) depositing a fuse material over a particular gap to electrically connect two electrode segments that are adjacent to and separated by the particular gap. The resistivity of the fuse material increases when a large current flows through the material. At least two of the electrode strips are connected to a common external contact.

An embodiment of a method to operate a fault-tolerant electroluminescent lighting device is also described. The lighting device includes an electrode that is patterned into a plurality of electrode strips and a particular one of the electrode strips includes a gap that separates the particular electrode strip into a first electrode segment and a second electrode segment. A fuse material at least partially covers the gap such that the first electrode segment is electrically connected to the second electrode segment. The method to operate the device includes driving a current across the fuse material, and if the current driven across the fuse material is high, then the resistivity of the fuse material is increased so that current flow across the fuse material is decreased.

DETAILED DESCRIPTION

An embodiment of the present invention pertains to an electroluminescent lighting source for area illumination. The electroluminescent lighting source is fault tolerant due, in part, to the patterning of one or both of the electrodes into strips, and each of one or more of these strips has a fuse formed on it. The fuses are integrated on the substrate. By using the integrated fuses, the number of external contacts that are used is minimized; preferably, the number of external contacts used is two (one for each of the two electrodes). The fuse material is deposited using one of the deposition techniques that is used to deposit the thin layers of the lighting device.

Figure 1:
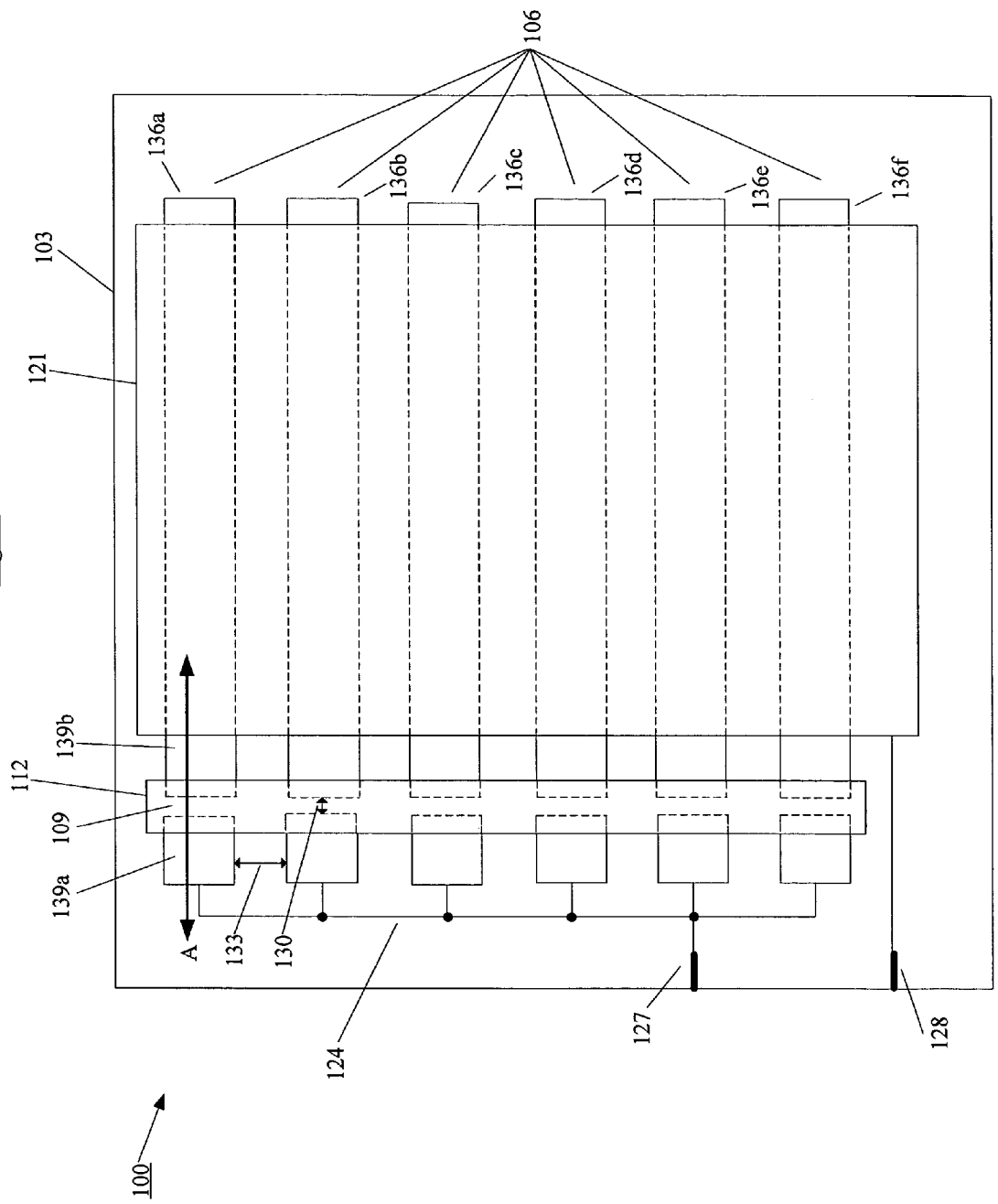
FIG. 1 shows a first embodiment of an OLED lighting device according to the present invention.

FIG. 1 shows a first embodiment of an OLED lighting device 100 according to the present invention. In this embodiment, a first electrode 106 is on a substrate 103. The first electrode 106 is patterned into multiple strips 136a-f and each of the strips 136a-f has a gap (e.g., strip 136a has a gap 109) that segments the strip into a first segment and a second segment (e.g., the gap 109 segments the strip 136a into a first strip segment 139a and a second strip segment 139b). Alternatively, not all of the strips 136a-f have the gap, but rather only one or some of the strips have the gap. The gap 109 prevents the flow of electric current between the first strip segment 139a and the second strip segment 139b. A fuse material 112 covers the gaps and electrically connects the first strip segments to the corresponding second strip segments. In the first embodiment shown in FIG. 1, the fuse material 112 is nonselectively deposited across the gaps such that the fuse material covers the gaps so that there is an electrical connection between the first strip segments and the corresponding second strip segments. The term "nonselectively deposited" as used herein refers to depositing the material in a manner such that a continuous uniform film is formed over a certain area. Examples of nonselective deposition techniques include, for example, evaporation, sputtering, chemical vapor deposition, spin coating, web coating, and spray coating. Because the fuse material 112 is nonselectively deposited, in addition to covering the gaps, the fuse material 112 also covers the area between adjacent strips. When the fuse material 112 is nonselectively deposited, then the gap width 130 should be substantially smaller than the distance between adjacent strips (this distance is shown by reference number 133) so that cross-talk between the adjacent strips can be neglected. An organic stack 115 is on the first electrode 106. A second electrode 121 is on the organic stack 115. In the embodiment shown in FIG. 1, the second electrode 121 is a common electrode. Conductive traces 124 connect all the strips 136a-f to a common external contact 127. The second electrode 121 is connected to a common external contact 128. Since the resulting fuses are integrated on the substrate 103, the number of common external contacts that are employed can be minimized.

When a voltage is applied between the common external contact 127 and the common external contact 128 such that the lighting device is forward biased, then light is emitted from the areas in which the first electrode 106, the organic stack 115, and the second electrode 121 intersect. During device operation, if a short occurs in one of the strips, then a large current will flow through the fuse material of the shorted strip causing the resisitivity of the fuse material to substantially increase.

Some of these device components are described in greater detail below.

Substrate 103:

The substrate 103 can be any material that can support the layers on it. The substrate 103 can be transparent or opaque (e.g., the opaque substrate is used in top-emitting devices). By modifying or filtering the wavelength of light that pass through the substrate 103, the color of light emitted by the device can be changed. The substrate 103 can be comprised of glass, quartz, silicon, plastic, ceramics, or circuit board materials; preferably, the substrate 103 is comprised of thin, flexible glass. Examples of plastic substrates are: polyethyleneterephthalate, polyethylenenapthalate, polyestercarbonate, polyethersulphone, and polyimide. The preferred thickness of the substrate 103 depends on the material used and the application.

First Electrode 106:

In one configuration of this embodiment, the first electrode 106 functions as an anode (the anode is a conductive layer which serves as a hole-injecting layer and which comprises a material with work function greater than about 4.5 eV). Typical anode materials include metals (such as platinum, gold, palladium, indium, and the like); metal oxides (such as lead oxide, tin oxide, indium tin oxide ("ITO"), and the like); graphite; doped inorganic semiconductors (such as silicon, germanium, gallium arsenide, and the like); and doped conducting polymers (such as polyaniline, polypyrrole, polythiophene, and the like).

In an alternative configuration, the first electrode 106 functions as a cathode (the cathode is a conductive layer which serves as an electron-injecting layer and which comprises a material with a low work function). The cathode, rather than the anode, is deposited on the substrate 103 in the case of, for example, a top-emitting OLED. Typical cathode materials are listed below in the section for the "second electrode 121".

The first electrode 106 can be transparent (e.g., this is the case in a bottom-emitting device), semi-transparent, or opaque (e.g., this may be the case in a top-emitting device) to the wavelength of light generated within the device. The thickness of the first electrode 106 is from about 10 nm to about 1000 nm, and preferably, from about 50 nm to about 200 nm.

The first electrode 106 can typically be fabricated using any of the techniques known in the art for deposition of thin films, including, for example, evaporation, sputtering, electron beam deposition, or chemical vapor deposition.

The first electrode 106 can be patterned using well-known photolithographic processes. The first electrode 106 can be patterned into strips (as shown in FIG. 1) and each of the strips include one or more gaps that separate the strip into two or more strip segments. The one or more gaps are on the substrate 103 and located outside the active area of the lighting device 100 (the active area, as used herein, is the area from which light is emitted). The fuse material 112 covers the gaps so that there is an electrical connection between each of the two adjacent strip segments that are separated by the corresponding gap.

The first electrode 106 can be connected to one or more common external contacts. More specifically, if the first electrode is patterned into strips, then two or more of the strips are coupled to one common external contact. By doing this, the number of external contacts that are used can be minimized. The common external contact is used to connect the first electrode to, for example, a voltage source or a current source.

Figure 5:
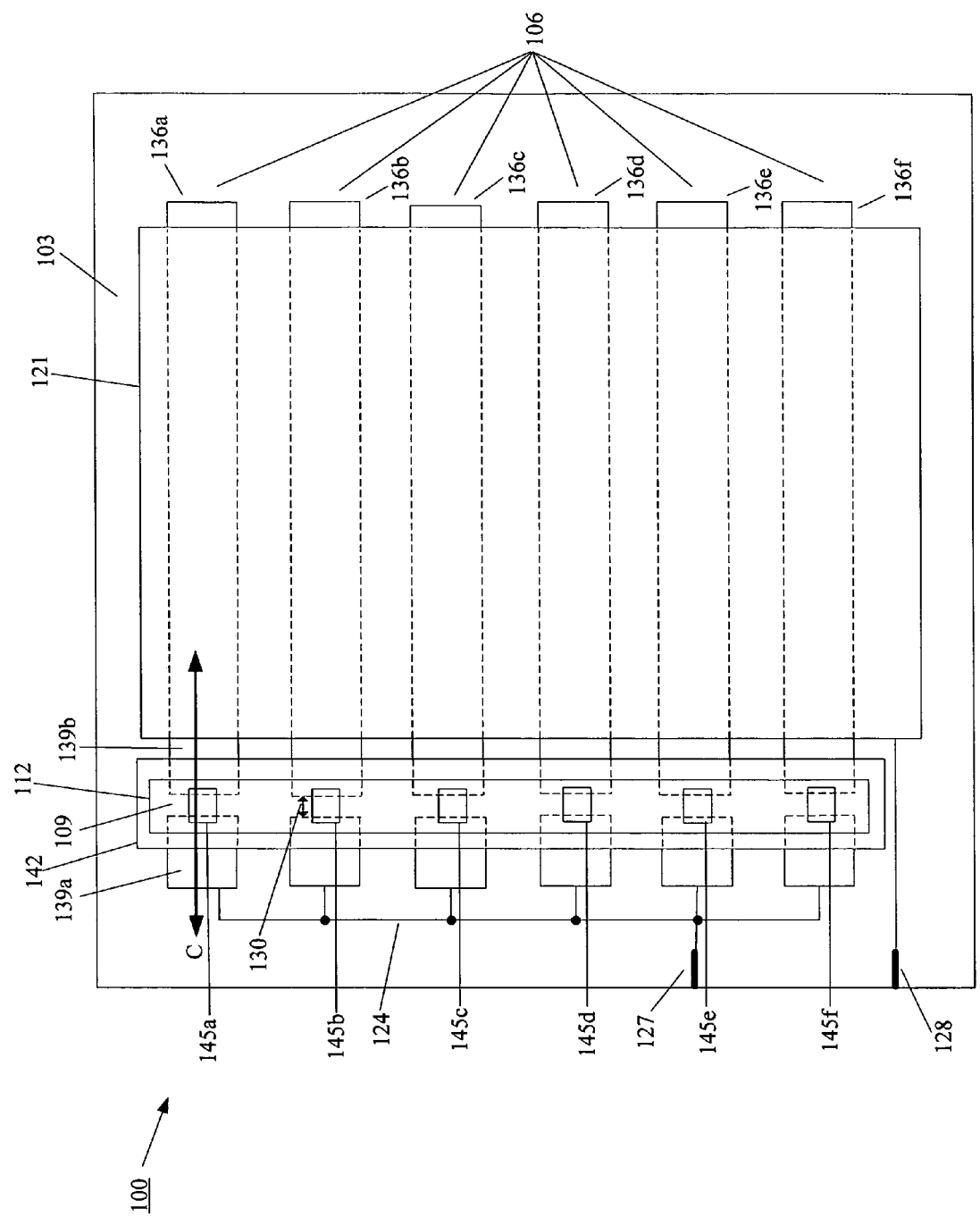
FIG. 5 shows a third embodiment of an OLED lighting device according to the present invention.

Bank Structure 142:

The bank structure 142 (the bank structure 142 is shown in FIG. 5) is made of a material such as, for example, photo-resist, polyimide, or poly-siloxane. The bank structure 142 is an insulating structure that has one or more apertures and these aperture(s) exposes the gap between two electrode strip segments. Each aperture may represent a pocket or a line. The bank structure 142 is patterned by applying photolithography techniques to the bank material, or by using a printing technique (e.g., screen printing or flexo-printing) to deposit the bank material in the desired pattern.

Fuse Material 112:

The fuse material 112 is a material that substantially increases its resistivity when there is a large current through it for a certain time period. In one configuration, the fuse material 112 is a material whose resistivity substantially increases due to redistribution of ionic charges within the fuse material 112 that produces an internal electric field that compensates for an external electric field produced by the large current. When the ionic redistribution completes, there is almost no current flowing through the material.

Alternatively, in another configuration, the fuse material 112 is a material whose resistivity substantially increases due to the bulk of the fuse material 112 increasing resistivity due to the large current through the material. The increase in resistivity can be due to the increased temperature resulting from the large current though the material. This type of fuse material can be either: (1) a blend of polymers or (2) a blend of polymers and small molecules. With regards to the polymer blend, when the temperature of the blend is at or above the glass transition temperature, the polymers move more freely and typically there is phase separation such that polymers of the same type cling to each other. If one type of polymers is conductive and another type of polymers is nonconductive, then there is a high likelihood that after phase separation, the resulting fuse material 112 will have a high resistivity.

Examples of fuse materials are: (1) PEDOT:PSS; (2) polycarbonate and polyaniline ("PANI"); (3) polymethylmethacrylate ("PMMA") and PANI; (4) polycarbonate and carbon fibers; (5) PMMA and carbon fibers; (6) polycarbonate and triphenyldiamine ("TPD"); (7) polycarbonate and naphthylphenyldiamine ("NPD"); (8) polycarbonate and tris (8-hydroxyquinolinato)aluminum ("Alq"); (9) PMMA and TPD; (10) PMMA and NPD; or (11) PMMA and Alq.

The fuse material 112 can be deposited using the same techniques as that used to deposit the layers of the organic stack. The fuse material 112 can be deposited using selective deposition techniques. The term "selectively deposited" as used herein refers to depositing the material in a manner such that the deposited material is patterned. Examples of selective deposition techniques include, for example: ink jet printing, flex printing, screen printing and shadow masking. The precision of the fuse material deposition is not critical and, therefore, it can also be deposited using non-selective deposition techniques such as, for example, evaporation, sputtering, chemical vapor deposition, spin coating, web coating, and spray coating.

The amount of fuse material deposited into the gap can vary within certain limits. At a minimum, there should be an adequate amount of fuse material in the gap so that there is an electrical connection between the two adjacent strip segments that the particular gap separates (e.g., in FIG. 1, there is an adequate amount of fuse material 112 in the gap 109 so that there is an electrical connection between the two adjacent strip segments—the first strip segment 139a and the second strip segment 139b). Also, enough fuse material can be deposited in the gap to substantially or completely fill the gap or even enough material can be deposited such that it slightly overflows the gap.

The gaps and the fuse material 112 are integrated on the device (i.e., the gaps and the fuse material 112 are on the substrate 103). The gaps and the fuse material 112 are outside the active area of the lighting device 100.

Organic Stack 115:

The OLED lighting device include an organic stack 115 between the first electrode 106 and the second electrode 121. The organic stack 115 includes one or more organic thin films. The organic stack 115 includes at least an emissive layer. The emissive layer is comprised of a luminescent or fluorescent material where electroluminescence is produced as a result of electron-hole pair recombination in this layer. The emissive layer can be comprised of organic polymers or organic small molecules. Preferably, the organic polymers are fully or partially conjugated polymers. For example, suitable organic polymer materials include one or more of the following in any combination: poly(p-phenylenevinylene) ("PPV"), poly(2-methoxy-5(2'-ethyl)hexyloxyphenylenevinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-((4-secbutylphenyl)imino)-1,4-phenylene) ("TFB"), poly(2,7-(9,9-di-n-octylfluorene)-(1,4-phenylene-((4-methylphenyl)imino)-1,4-phenylene-((4-methylphenyl)imino)-1,4-phenylene)) ("PFM"), poly(2,7-(9,9-di-n-octylfluorene)-(1,4-phenylene-((4-methoxyphenyl)imino)-1,4-phenylene)) ("PFMO"), poly (2,7-(9,9-di-n-octylfluorene) ("F8"), (2,7-(9,9-di-n-octylfluorene)-3,6-Benzothiadiazole) ("F8BT"), or poly(9,9-dioctylfluorene).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato)aluminum (Alq); (ii) 1,3-bis(N,N-dimethylaminophenyl)-1,3,4-oxidazole (OXD-8); (iii)-oxo-bis(2-methyl-8-quinolinato)aluminum; (iv) bis (2-methyl-8-hydroxyquinolinato)aluminum; (v) bis(hydroxybenzoquinolinato)beryllium (BeQ.sub.2); (vi) bis (diphenylvinyl)biphenylene (DPVBI); and (vii) arylamine-substituted distyrylarylene (DSA amine).

Optionally, the organic stack 115 can also include a hole transporting layer ("HTL") that is present between the anode and the emissive layer. The HTL may be used to increase the efficiency of the OLED lighting device. The HTL has much higher hole mobility than electron mobility and is used to effectively transport holes from the first electrode 106 to the emissive layer. Because employing the HTL provides a step in the highest occupied molecular orbital ("HOMO") energy level, the presence of the HTL may increase the number of holes injected into emissive layer 320. The HTL is a polarized layer; i.e., it is made of polar materials. The HTL is made of polymers or small molecules. For example, the HTL can be made of tertiary amine or carbazole derivatives both in their small molecule or their polymer form, conducting polyaniline ("PANI"), or polyethylenedioxythiophene-polystyrenesulfonate ("PEDOT:PSS"). The fuse material 112 can also be made of PEDOT:PSS.

The emissive layer and the HTL can be deposited using selective deposition techniques or nonselective deposition techniques, examples of which were provided earlier. As stated earlier, the fuse material 112 can be deposited using any of the deposition techniques used to deposit the layers of the organic stack 115.

Second Electrode 121:

In one configuration of this embodiment, the second electrode 121 functions as a cathode. The cathode is typically a multilayer structure that includes, for example, a thin charge injection layer and a thick conductive layer. The charge injection layer has a lower work function than the conductive layer. The charge injection layer can be comprised of, for example, calcium or barium or mixtures thereof. The conductive layer can be comprised of, for example, aluminum, silver, magnesium, gold, copper, or mixtures thereof.

In an alternative configuration, the second electrode 121 functions as an anode. The anode, rather than the cathode, is deposited on the organic stack 115 in the case of, for example, a top-emitting OLED lighting device. Typical anode materials are listed earlier in the section for the "first electrode 106".

The second electrode 121 can typically be fabricated using any of the techniques known in the art for deposition of thin films, including, for example, vacuum evaporation, sputtering, electron beam deposition, or chemical vapor deposition. The second electrode 121 can be patterned using well-known photolithographic processes. The second electrode 121 can be a common electrode (as shown in FIG. 1); alternatively, the second electrode 121 can be patterned into strips and each of the strips includes one or more gaps that separates the strip into two or more strip segments. The one or more gaps are located on the substrate and are outside the active area of the lighting device. The fuse material 112 covers the gaps so that there is an electrical connection between each of the two adjacent strip segments that are separated by the corresponding gap. Some possible combinations of the first electrode 106 and the second electrode 121 are: (1) the second electrode 121 is a common electrode and the first electrode 106 is patterned into strips and each of the strips include one or more gaps that separate the strip into two or more strip segments; (2) the first electrode 106 is a common electrode and the second electrode 121 is patterned into strips and each of the strips include one or more gaps that separate the strip into two or more strip segments; and (3) both the first electrode 106 and the second electrode 121 are patterned into strips, and each of the strips of one or both electrodes include one or more gaps that separate the strip into two or more strip segments. In case (3), the first electrode strips and the second electrode strips are parallel to each other and are aligned in the same direction.

The second electrode 121 can be connected to one or more common external contacts. More specifically, if the second electrode is patterned into strips, then two or more of the strips are coupled to one common external contact. By doing this, the number of external contacts that are used can be minimized. The common external contact is used to connect the second electrode 121 to, for example, a voltage source or a current source.

Figure 2:
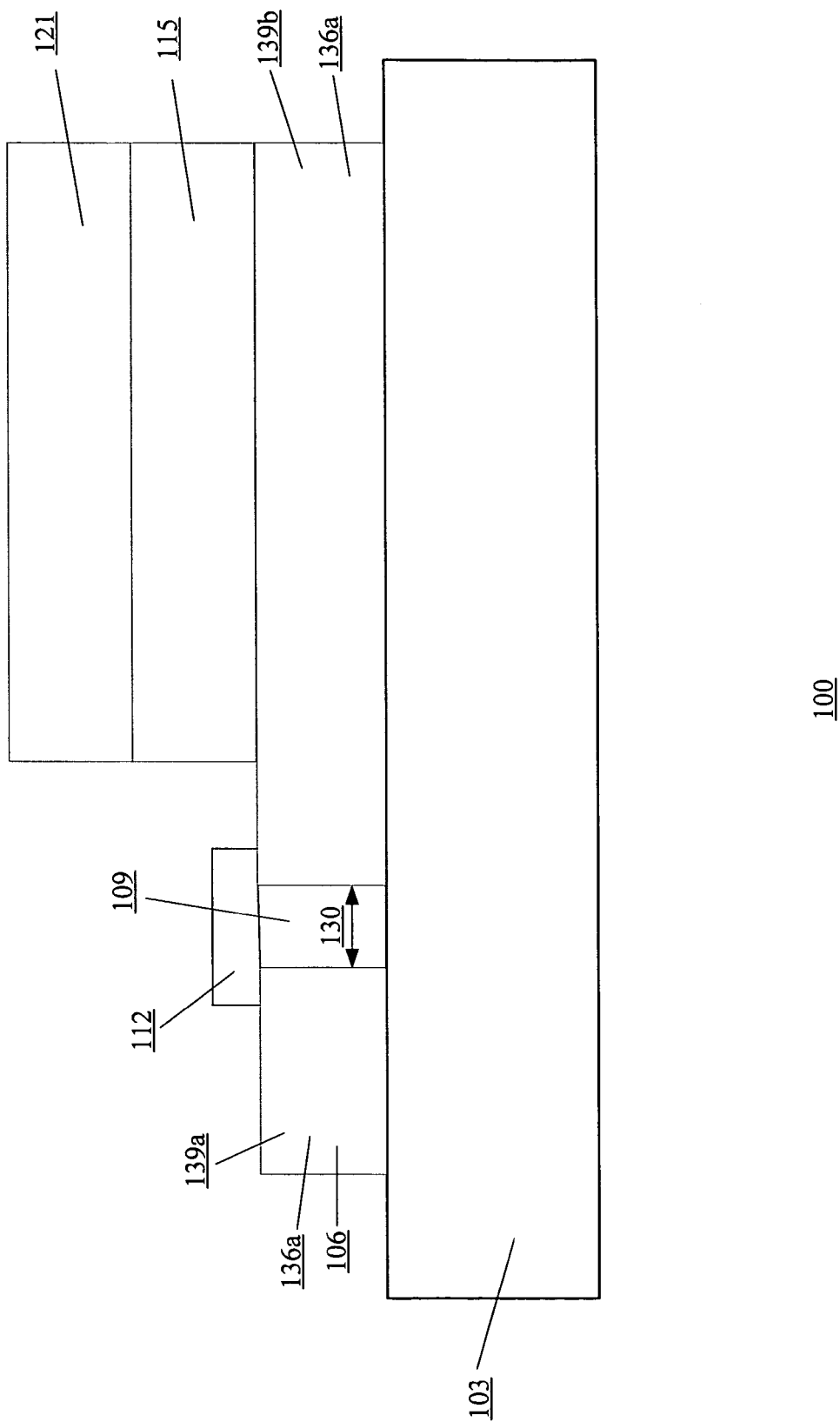
FIG. 2 shows a cross-sectional view of the first embodiment of the OLED lighting device according to the present invention.

FIG. 2 shows a cross-section at line A of the first embodiment of the OLED lighting device 100 according to the present invention. In FIG. 2, the first electrode 106 is on the substrate 103. The first electrode 106 is patterned into multiple strips and a particular one of these strips include one or more gaps that are on the substrate and located outside the active area of the lighting device. The one or more gaps in a strip segment the strip into two or more strip segments. Specifically, in FIG. 2, the strip 136a includes a gap 109 that segments the strip 136a into a first strip segment 139a and a second strip segment 139b. A fuse material 112 is nonselectively deposited on the first electrode 106 such that it covers the gap 109 and electrically connects the first strip segment 139a and the second strip segment 139b. When the fuse material 112 is nonselectively deposited, then the gap width 130 should be substantially smaller than the distance between adjacent strips so that cross-talk between the adjacent strips can be neglected. The organic stack 115 is on the first electrode 106. The second electrode 121 is on the organic stack 115.

Figure 3:
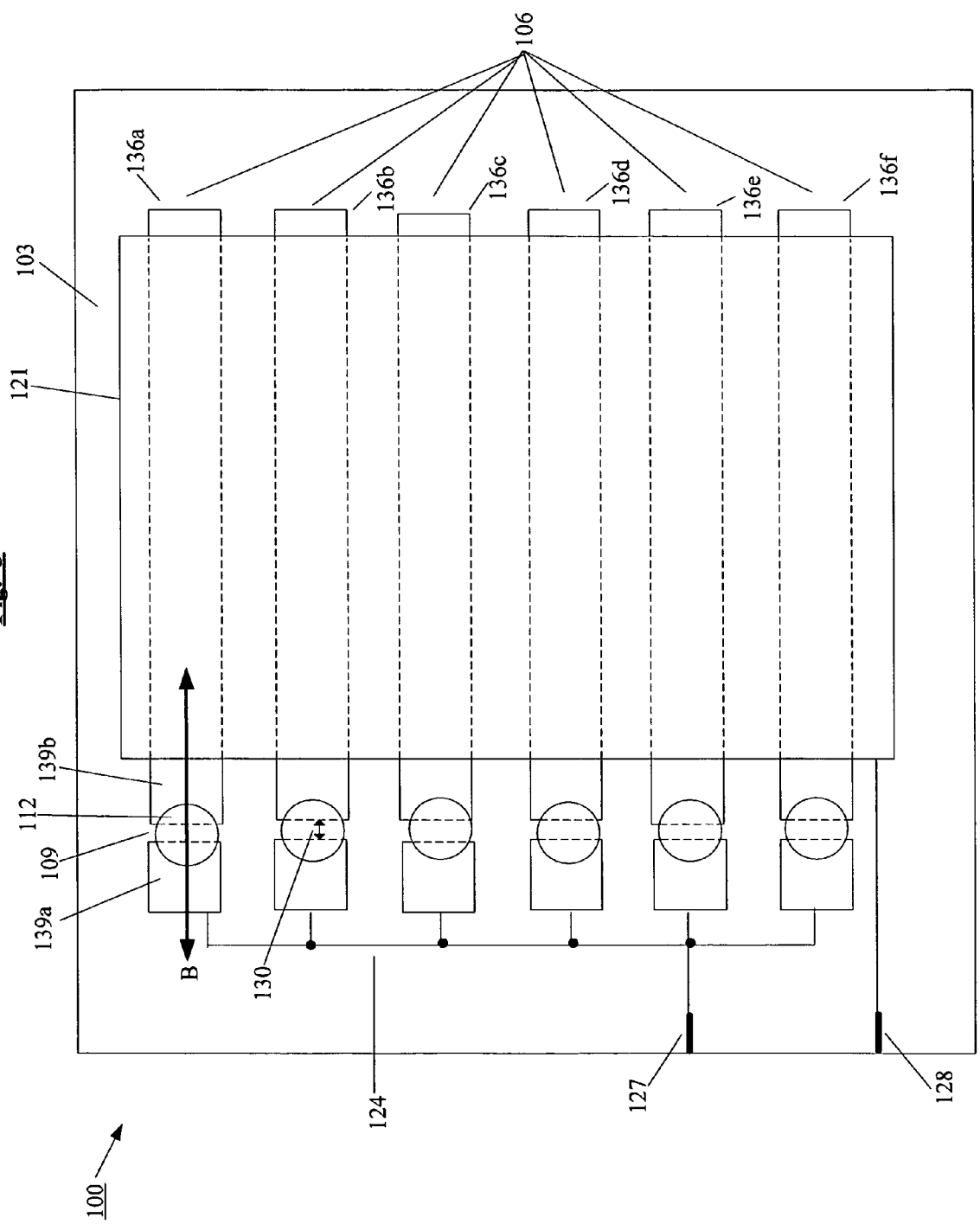
FIG. 3 shows a second embodiment of an OLED lighting device according to the present invention.

FIG. 3 shows a second embodiment of an OLED lighting device 100 according to the present invention. In this embodiment, a first electrode 106 is on a substrate 103. The first electrode 106 is segmented into multiple strips 136a-f and each of the strips 136a-f has a gap (e.g., strip 136a has a gap 109) that segments the strip into a first segment and a second segment (e.g., the gap 109 segments the strip 136a into a first strip segment 139a and a second strip segment 139b). The gap 109 prevents the flow of electric current between the first strip segment 139a and the second strip segment 139b. In this embodiment, the fuse material 112 is selectively deposited on the gaps so as to cover the gaps and provide an electrical connection between the first strip segments and the corresponding second strip segments. Specifically, in FIG. 3, the fuse material 112 is deposited on the gap 109 so as to provide an electrical connection between the first strip segment 139a and the second strip segment 139b. In this embodiment, since the fuse material 112 is selectively deposited, there is no fuse material between the adjacent strips and thus there is no cross-talk between the adjacent strips. In this case, the gap width 130 is not limited to being substantially smaller than the distance between adjacent strips. Examples of selective deposition techniques that can be used to deposit the fuse material 112 include, for example: ink jet printing, flex printing, screen printing and shadow masking. An organic stack 115 is on the first electrode 106. A second electrode 121 is on the organic stack 115. In the configuration of the embodiment shown in FIG. 3, the second electrode 121 is a common electrode. Conductive traces 124 connect all the strips 136a-f to a common external contact 127. The second electrode 121 is connected to a common external contact 128.

Figure 4:
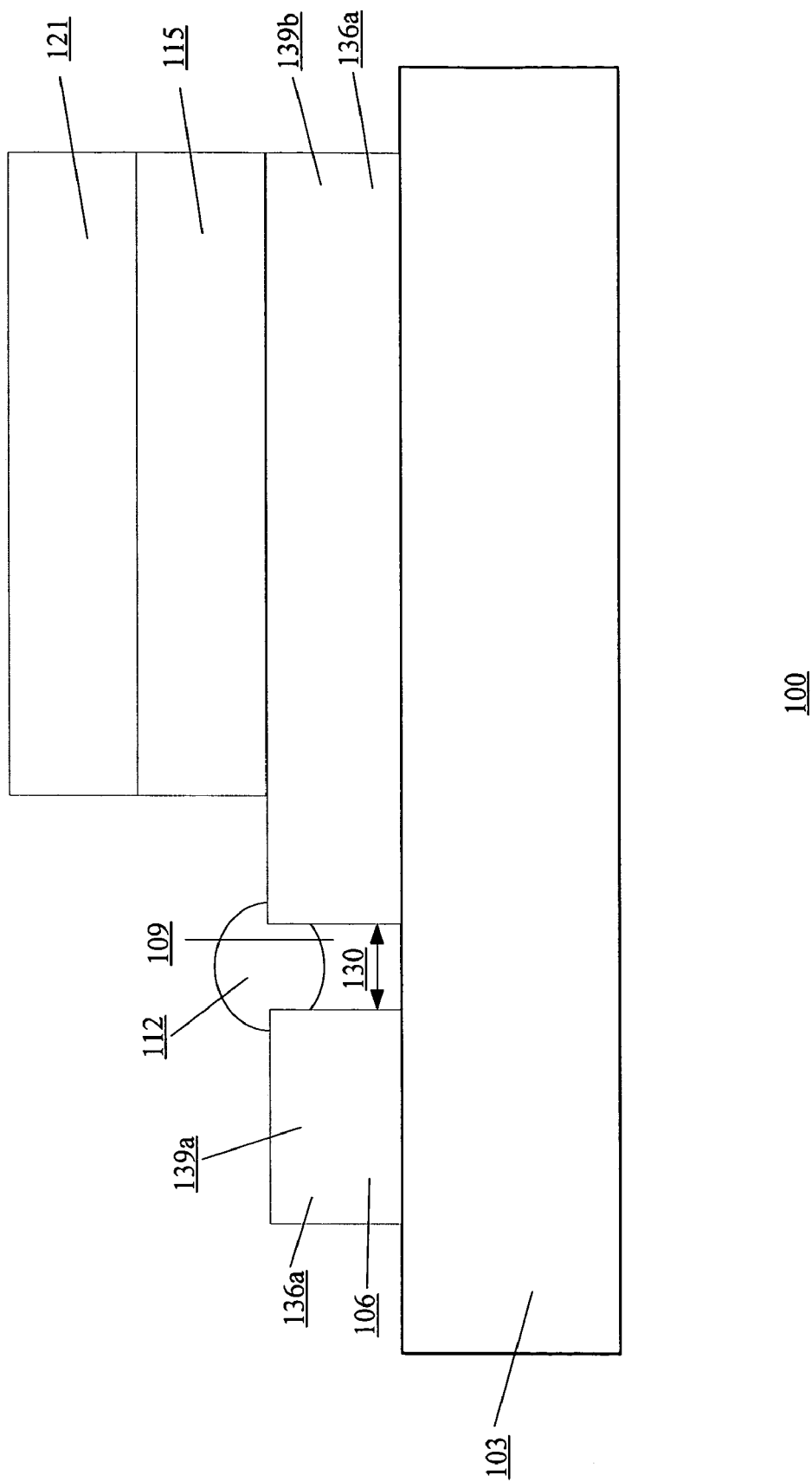
FIG. 4 shows a cross-sectional view of the second embodiment of the OLED lighting device according to the present invention.

FIG. 4 shows a cross-section at line B of the second embodiment of the OLED lighting device 100 according to the present invention. In FIG. 4, the first electrode 106 is on the substrate 103. The first electrode 106 is patterned into multiple strips and a particular one of these strips includes one or more gaps that are on the substrate and located outside the active area of the lighting device 100. The one or more gaps in a particular strip segment the strip into two or more strip segments. Specifically, in FIG. 4, the strip 136a includes a gap 109 that segments the strip 136a into a first strip segment 139a and a second strip segment 139b. A fuse material 112 is selectively deposited on the first electrode 106 such that it covers the gap 109 and electrically connects the first strip segment 139a and the second strip segment 139b. When the fuse material 112 is selectively deposited, then the gap width 130 can be any width and is not limited to being substantially smaller than the distance between adjacent strips. The organic stack 115 is on the first electrode 106. The second electrode 121 is on the organic stack 115.

FIG. 5 shows a third embodiment of the OLED lighting device 100 according to the present invention. In this embodiment, the first electrode 106 is on the substrate 103.

The first electrode 106 is patterned into multiple strips 136a-f and each of the strips 136a-f has a gap (e.g., strip 136a has a gap 109) that segments the particular strip into the first segment and a second segment (e.g., the gap 109 segments the strip 136a into a first strip segment 139a and a second strip segment 139b). The gap 109 prevents the flow of electric current between the first strip segment 139a and the second strip segment 139b. The bank structure 142 is formed on the first electrode 106 and includes the multiple apertures 145a-f. The apertures expose the gaps between the strip segments. For example, the aperture 145a in bank structure 142 exposes the gap 109 between the first strip segment 139a and the second strip segment 139b. The apertures can represent pockets or lines. In this embodiment, the fuse material 112 is nonselectively deposited on the bank structure 142 so as to cover the exposed gaps and provide an electrical connection between the first strip segments and the corresponding second strip segments. Specifically, in FIG. 5, the fuse material 112 is deposited on the bank structure 142 and fills the aperture 145a such that the gap 109 is covered and there is an electrical connection between the first strip segment 139a and the second strip segment 139b. The organic stack 115 is deposited on the first electrode 106. The second electrode 121 is on the organic stack 115. In the configuration of the embodiment shown in FIG. 5, the second electrode 121 is a common electrode. Conductive traces 124 connect all the strips 136a-f to a common external contact 127. The second electrode 121 is connected to a common external contact 128.

Figure 6:
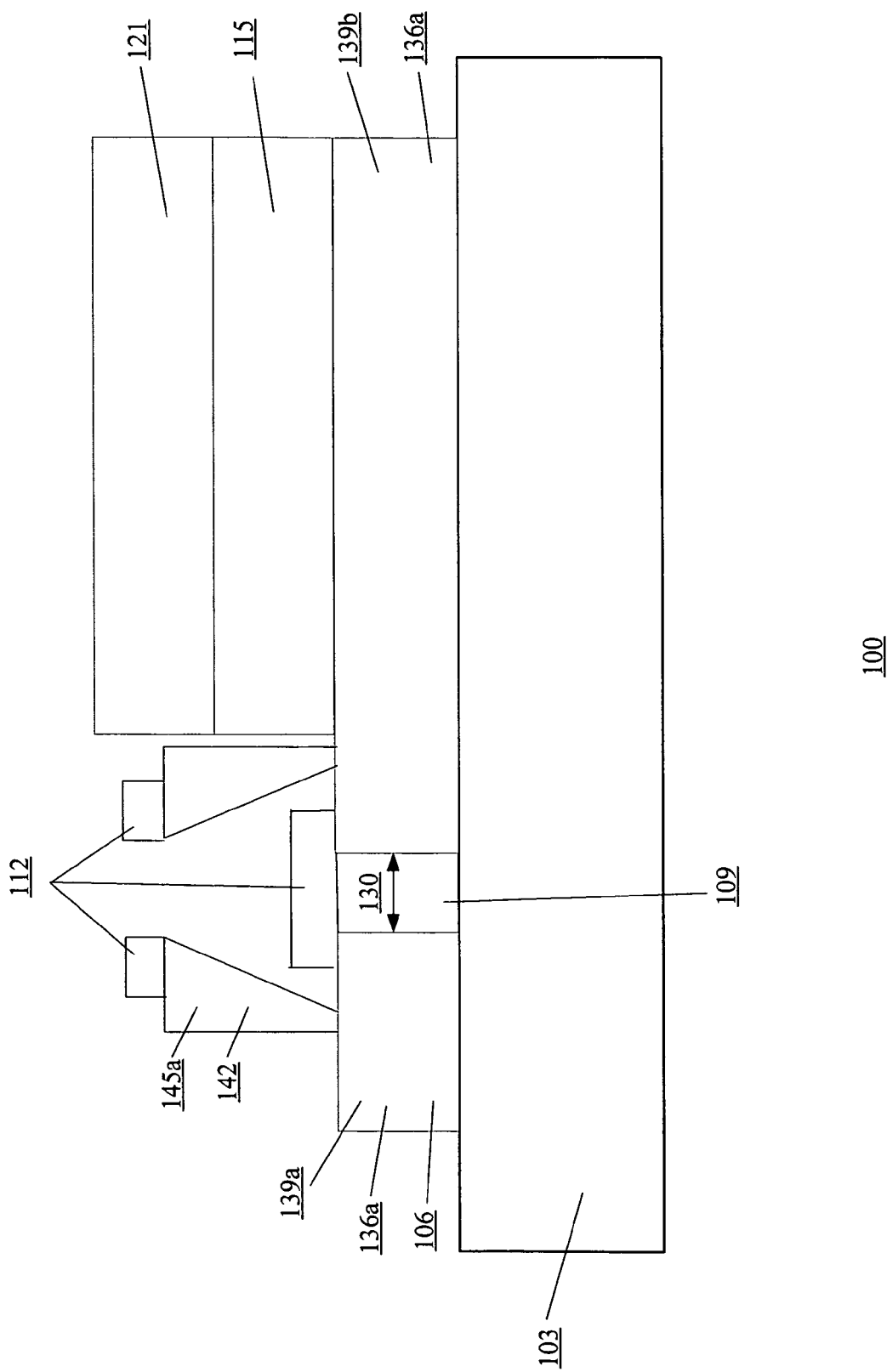
FIG. 6 shows a cross-sectional view of the third embodiment of the OLED lighting device according to the present invention.

FIG. 6 shows a cross-section at line C of the third embodiment of the OLED lighting device 100 according to the present invention. In FIG. 6, the first electrode 106 is on the substrate 103. The first electrode 106 is patterned into multiple strips and a particular one of these strips includes one or more gaps that are on the substrate and located outside the active area of the lighting device 100. The one or more gaps in a particular strip segment the strip into two or more strip segments. Specifically, in FIG. 6, the strip 136a includes a gap 109 that segments the strip 136a into a first strip segment 139a and a second strip segment 139b. The bank structure 142 is on the first electrode 106. If the bank structure 142 protrudes outward at the top (as shown in FIG. 6), then there is discontinuity between the fuse material 112 on the bank structure 142 and the fuse material 112 covering the gap 109, and thus there is no cross-talk between adjacent strips. In this case, the gap width 130 is not limited to being substantially smaller than the distance between adjacent strips. Alternatively, the bank structure 142 can be shaped so that when the fuse material 112 is nonselectively deposited, there is continuity between the fuse material 112 on the bank structure 142 and the fuse material 112 covering the gap 109, and in this case, the gap width 130 should be substantially smaller than the distance between adjacent strips in order to adequately minimize the cross-talk between adjacent strips. An example of such a bank structure shape is a rectangular shaped bank structure. The fuse material 112 is nonselectively deposited across the bank structure 142 such that the material fills the aperture 145a so as to covers the gap 109 and electrically connects the first strip segment 139a and the second strip segment 139b. The organic stack 115 is on the first electrode 106. The second electrode 121 is on the organic stack 115.

Figure 7:
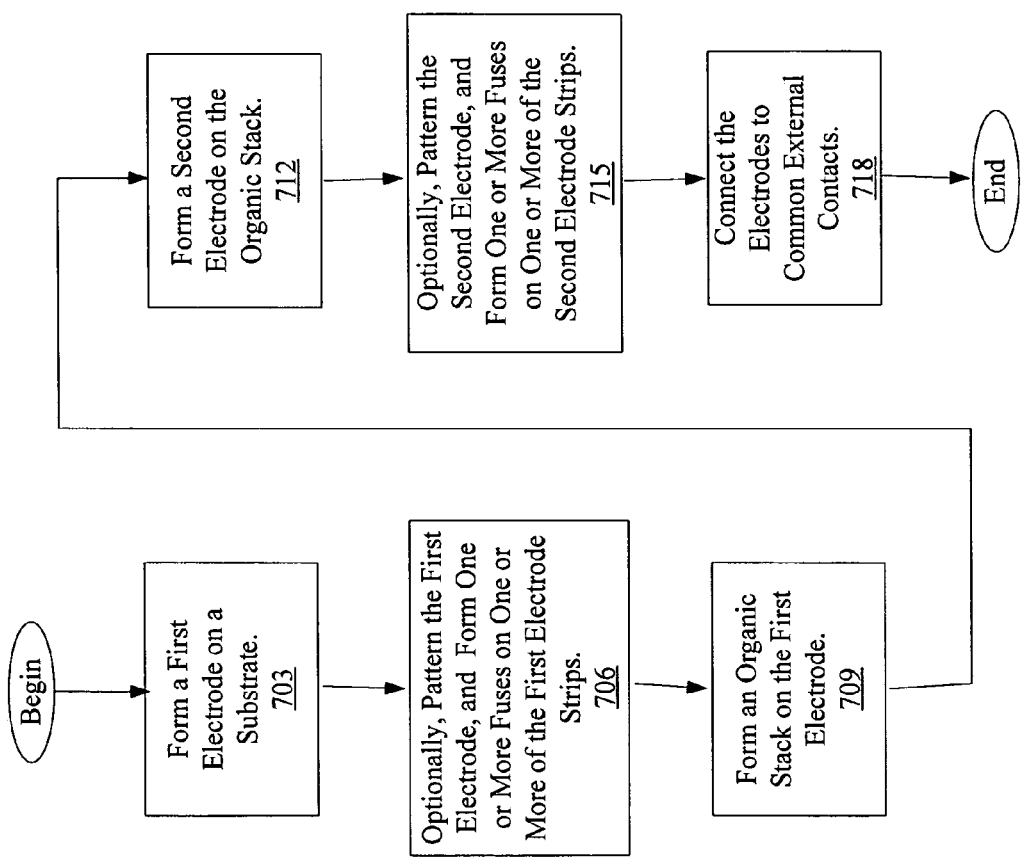
FIG. 7 shows an embodiment of a method to fabricate the fault-tolerant OLED lighting device according to the present invention.

FIG. 7 shows an embodiment of a method to fabricate the fault-tolerant OLED lighting device 100 according to the present invention. In block 703, the first electrode is formed on a substrate. In order to make the lighting device fault-tolerant, one or both electrodes are patterned into strips. In block 706, optionally, the first electrode is patterned into multiple strips, and each of one or more of the patterned strips includes one or more gaps that segment the particular strip into two or more strip segments. Optionally, a bank structure can be formed on the first electrode using techniques such as, for example, photolithography. The fuse material is selectively or nonselectively deposited over each of the one or more gaps so that there is an electrical connection between the two electrode segments that are adjacent to and separated by a particular gap. The resulting fuse is located on the substrate and outside the active area of the lighting device. In block 709, the organic stack is formed on the first electrode. In block 712, the second electrode is formed on the organic stack. In block 715, optionally, the second electrode is patterned into multiple strips, and each of one or more of the patterned strips includes one or more gaps that segment the particular strip into two or more strip segments. The fuse material is selectively or nonselectively deposited over each of the one or more gaps so that there is an electrical connection between the two electrode segments that are adjacent to and separated by a particular gap. In block 718, the first electrode is connected to one or more common external contacts. More specifically, if the first electrode is patterned into strips, then two or more of the strips are coupled to one common external contact. In addition, the second electrode is connected to one or more common external contacts. More specifically, if the second electrode is patterned into strips, then two or more of the strips are coupled to one common external contact.

The invention has been described with respect to an organic lighting source for area illumination, however, this invention can also be used within an inorganic lighting source. In this case, one or more thin-films between the first electrode and the second electrode are made of inorganic materials. For example, the emissive layer can be made of inorganic materials such as, for example, gallium arsenide, indium phosphide, or zinc selenide. Similarly, the inorganic hole transporting layer can be comprised of inorganic materials such as, for example, doped gallium arsenide.

Alternatively, one or more thin layers between the first electrode and the second electrode are made of organic materials while one or more of the other layers between the two electrodes are made of inorganic materials.

As any person of ordinary skill in the art of organic optoelectronic device fabrication will recognize from the description, figures, and examples that modifications and changes can be made to the preferred embodiments of the invention without departing from the scope of the invention defined by the following claims.

What is claimed:

1. A fault-tolerant electroluminescent lighting device, comprising:
   a substrate;
   a first electrode on said substrate;
   a thin-film stack on said first electrode, wherein said thin-film stack includes an electroluminescent layer;
   a second electrode on said thin-film stack,
   wherein a particular one of either said first electrode or said second electrode is a plurality of electrode strips, a particular one of said plurality of electrode strips has at least one gap that separates said particular electrode strip into a plurality of electrode segments, and a fuse material at least partially covers a particular one of said at least one gap such that two adjacent electrode segments that are separated by said particular gap are electrically connected to each other, and resistivity of said fuse material increases when a large current flows through said fuse material, and
wherein said at least one gap is on said substrate, and at least two of said plurality of electrode strips are coupled to a common external contact.

2. The device of claim 1 wherein said fuse material's resistivity increases when the large current flows due to redistribution of ionic charges within said fuse material that produces an internal electric field that compensates for an external electric field produced by the high current flow.

3. The device of claim 1 wherein said fuse material's resistivity increases when a large current flows due to the bulk of said fuse material increasing resistivity when said large current flows.

4. The device of claim 3 wherein said fuse material whose bulk increases resistivity when high current flows is: (1) a blend of polymers or (2) a blend of polymers and small molecules.

5. The device of claim 4 wherein said blend of polymers phase separate when a temperature of said blend increases above said polymers glass transition temperature.

6. The device of claim 1 wherein said fuse material is any one of: (1) PEDOT:PSS; (2) polycarbonate and polyaniline ("PANI"); (3) polymethylmethacrylate ("PMMA") and PANI; (4) polycarbonate and carbon fibers; (5) PMMA and carbon fibers; (6) polycarbonate and triphenyldiamine ("TPD"); (7) polycarbonate and naphthylphenyldiamine ("NPD"); (8) polycarbonate and tris(8-hydroxyquinolinato) aluminum ("Alq"); (9) PMMA and TPD; (10) PMMA and NPD; or (11) PMMA and Alq.

7. The device of claim 1 further comprising a bank structure on said particular electrode, said bank structure includes a plurality of apertures, wherein a particular one of said plurality of apertures exposes said particular one of said at least one gap.

8. The device of claim 1 wherein a width of said particular one of said at least one gap is substantially smaller than a distance between two adjacent electrode strips.

9. The device of claim 1 wherein said fuse material is on said substrate.

10. The device of claim 1 wherein said other electrode that is not said particular electrode is a common continuous electrode.

11. The device of claim 1 wherein said other electrode that is not said particular electrode is a plurality of other electrode strips, said plurality of other electrode strips are parallel and aligned in the same direction as said plurality of electrode strips.

12. The device of claim 1 wherein said fault-tolerant electroluminescent lighting device is a fault-tolerant OLED lighting device.

13. A method to fabricate a fault-tolerant electroluminescent lighting device, comprising:
forming a first electrode on a substrate;
forming a thin-film stack on said first electrode, wherein said stack includes at least one layer and a particular one of said at least one layer is an electroluminescent layer; and
forming a second electrode on said thin-film stack,
wherein forming a particular one of either said first electrode or said second electrode includes:
patterning said particular electrode into a plurality of electrode strips, and further patterning at least one gap on a particular one of said plurality of electrode strips so as to separate said particular electrode strip into a plurality of electrode segments, wherein said at least one gap is on said substrate; and
depositing a fuse material over a particular one of said at least one gap to electrically connect two electrode segments that are adjacent to and separated by said particular gap, wherein resistivity of said fuse material increases when a large current flows through said fuse material, and
further comprising coupling at least two of said plurality of electrode strips to a common external contact.

14. The method of claim 13 wherein forming said thin-film stack includes depositing a particular one of said at least one layer using a particular deposition technique, and said particular deposition technique is also used to deposit said fuse material.

15. The method of claim 13 further comprising forming a bank structure on said particular electrode, said bank structure includes a plurality of apertures, wherein a particular one of said plurality of apertures exposes said particular one of said at least one gap.

16. The method of claim 13 wherein said fuse material is selectively deposited.

17. The method of claim 16 wherein said fuse material is selectively deposited using any of the following techniques: ink-jet printing, screen printing, flex printing, or shadow masking.

18. The method of claim 13 wherein said fuse material is nonselectively deposited.

19. The method of claim 18 wherein said fuse material is nonselectively deposited using any of the following techniques: evaporation, sputtering chemical vapor deposition, spin coating, web coating, or spray coating.

20. The method of claim 18 wherein if said fuse material is nonselectively deposited, then a width of said particular one of said at least one gap is substantially smaller than a distance between two adjacent electrode strips.

21. The method of claim 13 wherein said fuse material is any one of: (1) PEDOT:PSS; (2) polycarbonate and polyaniline ("PANI"); (3) polymethylmethacrylate ("PMMA") and PANI; (4) polycarbonate and carbon fibers; (5) PMMA and carbon fibers; (6) polycarbonate and triphenyldiamine ("TPD"); (7) polycarbonate and naphthylphenyldiamine ("NPD"); (8) polycarbonate and tris(8-hydroxyquinolinato) aluminum ("Alq"); (9) PMMA and TPD; (10) PMMA and NPD; or (11) PMMA and Alq.

22. The method of claim 13 wherein said other electrode that is not said particular electrode is a common continuous electrode.

23. The method of claim 13 wherein forming said other electrode that is not said particular electrode includes
patterning said other electrode into a plurality of other electrode strips, wherein said plurality of other electrode strips are parallel and aligned in the same direction as said plurality of electrode strips.

24. A fault-tolerant electroluminescent lighting device produced according to the method of claim 13.

25. A fault-tolerant OLED lighting device produced according to the method of claim 13.

26. A method to operate a fault-tolerant electroluminescent lighting device, wherein said lighting device includes an electrode that is patterned into a plurality of electrode strips and a particular one of said plurality of electrode strips includes a gap that separates said particular electrode strip into a first electrode segment and a second electrode segment, wherein a fuse material at least partially covers said gap such that said first electrode segment is electrically connected to said second electrode segment, the method comprising:

driving a current across said fuse material; and if the current driven across said fuse material is high, then increasing resistivity of said fuse material so that current flow across said fuse material is decreased.

27. The method of claim 26 wherein said resistivity of said fuse material is increased when current flow is high across said fuse material by redistributing ionic charges within said fuse material to produce an internal electric field that compensates for an external electric field produced by the high current flow.

28. The method of claim 26 wherein said fuse material's resistivity increases when current flow is high due to the bulk of said fuse material increasing resistivity when said current flow is high.

29. The method of claim 28 wherein said fuse material is: (1) a blend of polymers or (2) a blend of polymers and small molecules.

30. The method of claim 29 wherein said blend of polymers phase separate when a temperature of said blend increases above said polymers' glass transition temperature.

31. The method of claim 26 wherein said fuse material is any one of: (1) PEDOT:PSS; (2) polycarbonate and polyaniline ("PANI"); (3) polymethylmethacrylate ("PMMA") and PANI; (4) polycarbonate and carbon fibers; (5) PMMA and carbon fibers; (6) polycarbonate and triphenyldiamine ("TPD"); (7) polycarbonate and naphthylphenyldiamine ("NPD"); (8) polycarbonate and tris(8-hydroxyquinolinato) aluminum ("Alq"); (9) PMMA and TPD; (10) PMMA and NPD; or (11) PMMA and Alq.

\* \* \* \* \*